(12) United States Patent
Goushcha et al.

(10) Patent No.: US 7,112,465 B2
(45) Date of Patent: Sep. 26, 2006

(54) FABRICATION METHODS FOR ULTRA THIN BACK-ILLUMINATED PHOTODIODE ARRAY

(75) Inventors: Alexander O. Goushcha, Riverside, CA (US); Chris Hicks, Costa Mesa, CA (US); Richard A. Metzler, Mission Viejo, CA (US); Mark Kalatsky, Laguna Beach, CA (US); Eddie Bartley, Long Beach, CA (US); Dan Tulbure, Coto de Caza, CA (US)

(73) Assignee: Semicoa Semiconductors, Costa Mesa, CA (US)

( * ) Notice: Subject to any disclaimer, the term of this patent is extended or adjusted under 35 U.S.C. 154(b) by 0 days.

(21) Appl. No.: 10/863,558

(22) Filed: Jun. 8, 2004

(65) Prior Publication Data

US 2004/0262652 A1    Dec. 30, 2004

Related U.S. Application Data

(62) Division of application No. 10/606,053, filed on Jun. 25, 2003, now Pat. No. 6,762,473.

(51) Int. Cl.
    *H01L 21/22*    (2006.01)
(52) U.S. Cl. .................. 438/73; 257/443; 257/460; 438/60
(58) Field of Classification Search ........... 257/460, 257/443–448; 438/144–148, 73
See application file for complete search history.

(56) References Cited

U.S. PATENT DOCUMENTS

| | | | |
|---|---|---|---|
| 4,144,096 A | | 3/1979 | Wada et al. |
| 5,072,312 A | * | 12/1991 | Schwarzbauer et al. .... 257/168 |
| 5,075,748 A | | 12/1991 | Hisa |
| 5,538,564 A | | 7/1996 | Kaschmitter |
| 5,670,383 A | * | 9/1997 | Piccone et al. ............... 438/91 |
| 6,111,305 A | | 8/2000 | Yoshida et al. |
| 6,184,100 B1 | | 2/2001 | Arai |
| 6,426,991 B1 | | 7/2002 | Mattson et al. |
| 6,504,178 B1 | | 1/2003 | Carlson et al. ............... 257/86 |

(Continued)

OTHER PUBLICATIONS

Derenzo, Stephen E., "Initial Characterization of a BGO-Photodiode Detector for High Resolution Positron Emission Tomography", Feb. 1984, IEEE Transactions on Nuclear Science, vol. NS-31, No. 1, pp. 620-626.

(Continued)

*Primary Examiner*—Howard Weiss
*Assistant Examiner*—John Ingham
(74) *Attorney, Agent, or Firm*—Blakely Sokoloff Taylor & Zafman LLP (57) ABSTRACT

Ultra thin back-illuminated photodiode array structures and fabrication methods. The photodiode arrays are back illuminated photodiode arrays having a substrate of a first conductivity type having first and second surfaces, the second surface having a layer of the first conductivity type having a greater conductivity than the substrate. The arrays also have a matrix of regions of a first conductivity type of a higher conductivity than the substrate extending from the first surface of the substrate to the layer of the first conductivity type having a greater conductivity than the substrate, a plurality of regions of the second conductivity type interspersed within the matrix of regions of the first conductivity type and not extending to the layer of the first conductivity type on the second surface of the substrate, and a plurality of contacts on the first surface for making electrical contact to the matrix of regions of the first conductivity type and the plurality of regions of the second conductivity type.

30 Claims, 9 Drawing Sheets

U.S. PATENT DOCUMENTS

| | | |
|---|---|---|
| 6,653,164 B1 | 11/2003 | Miida |
| 6,933,489 B1 * | 8/2005 | Fujii et al. ............... 250/214.1 |
| 2002/0020846 A1 | 2/2002 | Pi et al. |
| 2002/0058353 A1 | 5/2002 | Merrill |
| 2002/0148967 A1 | 10/2002 | Iwanczyk et al. |
| 2003/0209652 A1 | 11/2003 | Fujii et al. |
| 2004/0104351 A1 | 6/2004 | Shibayama |
| 2004/0129992 A1 | 7/2004 | Shibayama ................ 257/443 |

OTHER PUBLICATIONS

Takahashi, Tetsuhiko et al., "Design of Integrated Radiation Detectors with a-Si Photodiodes on Ceramic Scintillators for use in X-Ray Computed Tomography", Jun. 1990, IEEE Transactions on Nuclear Science, vol. 37, No. 3, pp. 1478-1482.

Burns, H. N. "Buck" et al., "Compact, 625-channel scannerless imaging laser radar receiver", 1996, Proc. SPIE, vol. 2748, pp. 39-46.

Iwanczyk, J.S. et al., "Simulation and modelling of a new silicon X-ray drift detector design for synchrotron radiation applications", 1996, Nuclear Instruments and Methods in Physics Research, Section A, vol. 380, pp. 288-294.

Kwa, Tommy A. et al., "Backside-Illuminated Silicon Photodiode Array for an Integrated Spectrometer", May 1997, IEEE Transactions on Electron Devices, vol. 44, No. 5, pp. 761-765.

Holland, S.E. et al., "Development of Low Noise, Back-Side Illuminated Silicon Photodiode Arrays", Jun. 1997, IEEE Transactions on Nuclear Science, vol. 44, No. 3, pp. 443-447.

Patt, B.E. et al., "High Resolution CsI(T1)/Si-PIN Detector Development for Breast Imaging", Aug. 1998, IEEE Transactions on Nuclear Science, vol. 45, No. 4, pp. 2126-2131.

Vishay Semiconductors S268P Data Sheet, "Silicon PIN Photodiode Array", May 20, 1999, Document No. 81538, pp. 1-5.

Detection Technology, Inc., "New Photodiode Array Products for Computer Tomography-Detectors", News Bulletin for the Customers and Cooperation Partners, Winter 2000-2001.

Patt, B.E. et al., "Fast-Timing Silicon Photodetectors", Jun. 2000, IEEE Transactions on Nuclear Science, vol. 47, No. 3, pp. 957-964.

Hamamatsu Photonics K.K., Solid State Division, "Si Photodiode Catalog", Feb. 2002, pp. 1-25.

Tornai, Martin P. et al., "A novel silicon array designed for intraoperative charged particle imaging", Nov. 2002, Medical Physics, vol. 29, No. 11, pp. 2529-2540.

Luhta, Randy et al., "Back Illuminated Photodiodes for Multislice CT", Feb. 15-20, 2003, San Diego, California USA.

Yang, Min et al., "High Speed Silicon Lateral Trench Detector on SOI Substrate", International Electron Devices Meeting, Dec. 2-5, 2001, New York, NY, IEDM Technical Digest, pp. 24.1.1-24.1.4, IEEE, US.

* cited by examiner

Figure 6

FABRICATION METHODS FOR ULTRA THIN BACK-ILLUMINATED PHOTODIODE ARRAY

CROSS-REFERENCE TO RELATED APPLICATIONS

This application is a divisional of U.S. patent application Ser. No. 10/606,053, filed Jun. 25, 2003 now U.S. Pat. No. 6,762,473.

BACKGROUND OF THE INVENTION

1. Field of the Invention

The present invention relates to semiconductor photodiodes, and in particular, to the structures of high performance, back-illuminated photodiode arrays and the methods of fabricating such structures.

2. Prior Art

Figure 1A:
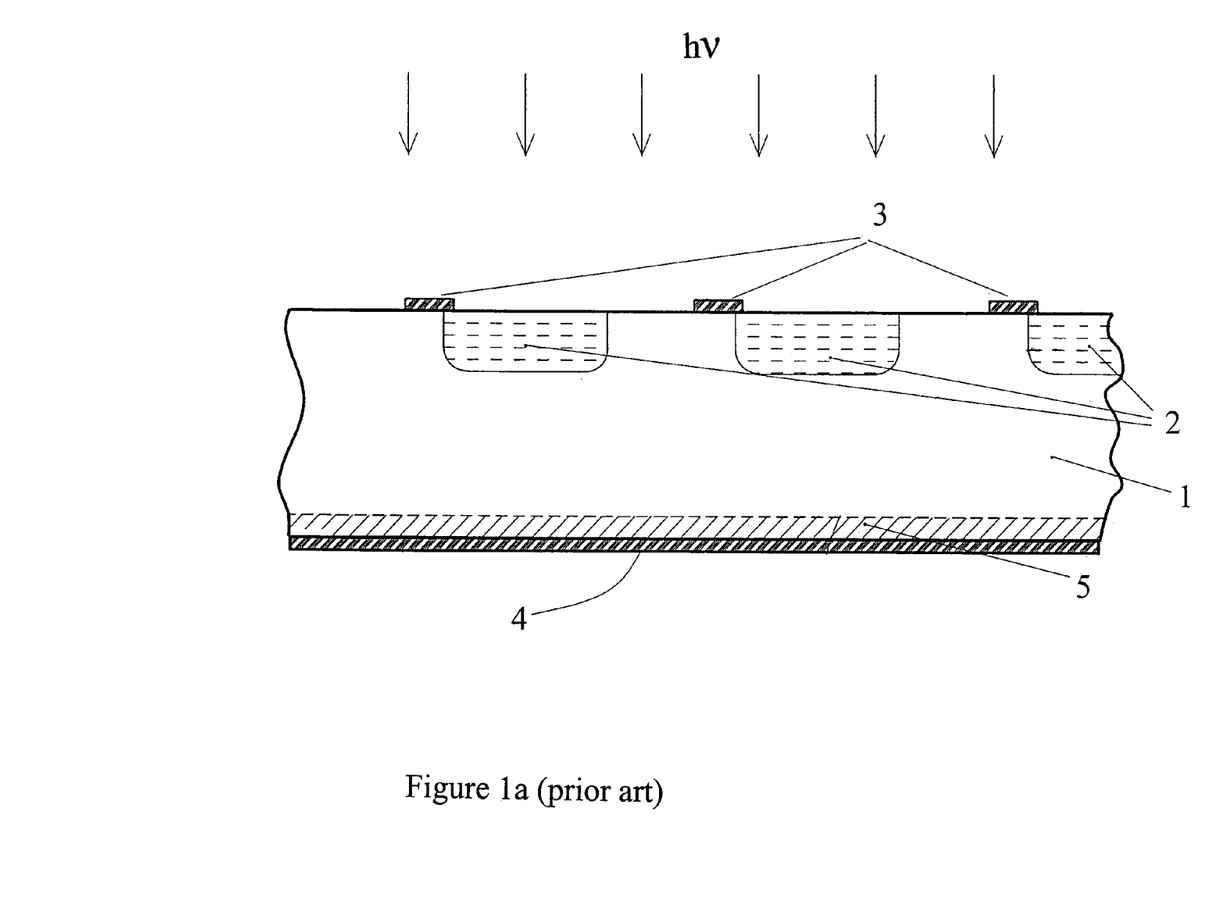
FIGS. 1a and 1b are schematic cross sections of typical, conventional prior art structures for the front illuminated photodiode arrays and back illuminated photodiode arrays, respectively.
Figure 1B:
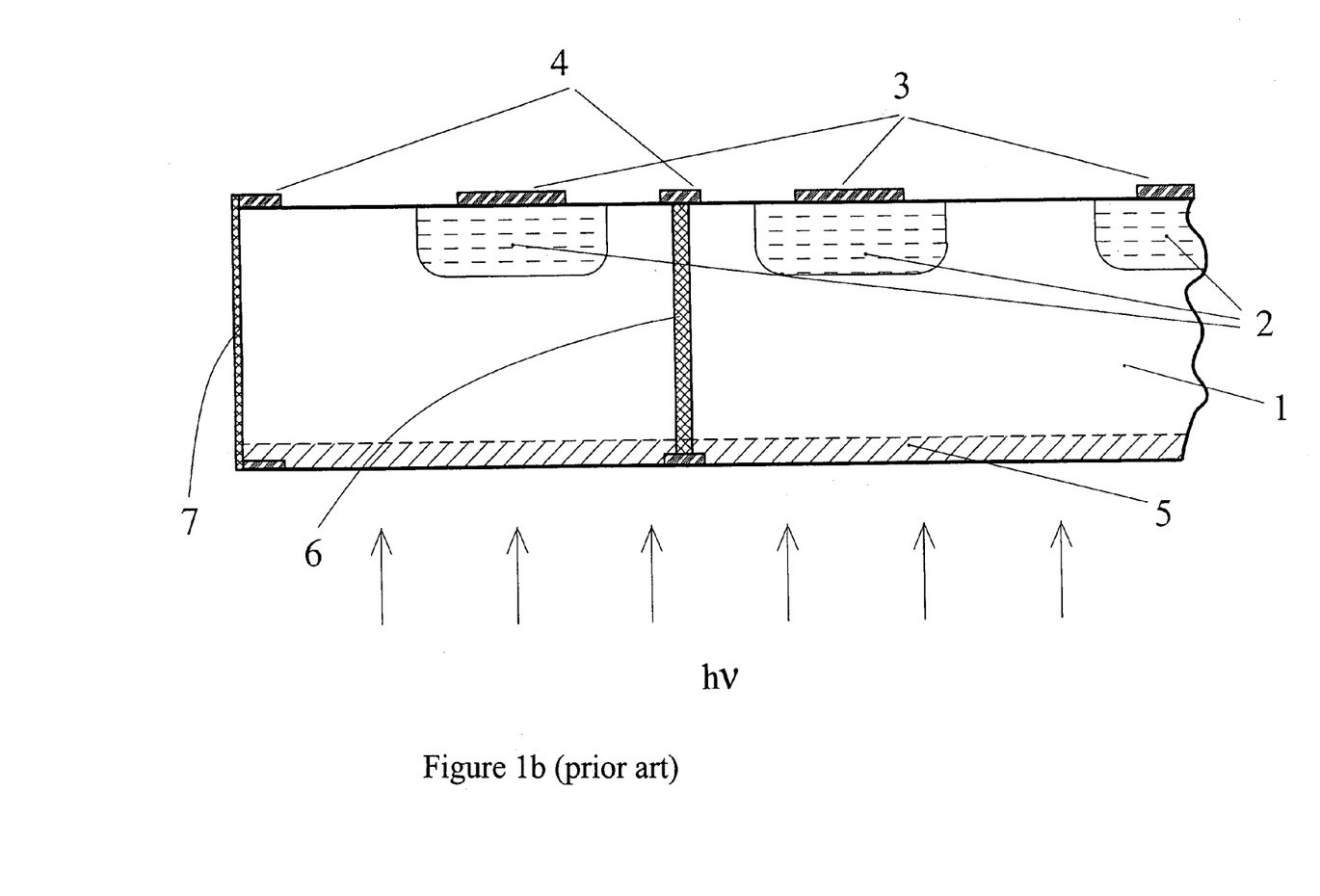

Conventional photodiode array structures are based on either front illuminated or back illuminated technologies. FIG. 1a is a simplified cross section of an exemplary prior art front illuminated photodiode array and FIG. 1b is a simplified cross section of an exemplary prior art back illuminated photodiode array. The substrate 1 may be either n-type or p-type material, with opposite conductivity type diffused regions 2 therein. This creates a p-on-n or n-on-p structure, respectively. The anode metal pads 3 for the p-on-n structure (the cathode contacts for the n-on-p structure) are always on the device front surface. The opposite polarity electrode is usually deposited (plated, sputtered, or evaporated) on the chip back side in the case of the front illuminated structure (see metal layer 4, FIG. 1a), or is made on the device front surface (see metal pads 4, FIG. 1b) using metallized through vias 6,7 in the case of the back illuminated structure. The blanket-type implantation 5 of the back surface of the die of the same conductivity type as the substrate improves both the charge collection efficiency and DC/AC electrical performance of the devices.

Each of the two approaches—the front illuminated and back illuminated structures—has its own advantages and disadvantages. For example, traditional front illuminated structures like that shown in FIG. 1a allow building high performance photodiodes and photodiode arrays, but impose severe constraints on the metal run width. Those constraints limit a design of the front illuminating photodiode array to the use of either a smaller number of elements, or larger gaps between adjacent elements. Note that the metal runs should be accommodated in between adjacent diffusion areas 2 (see FIG. 1a).

Back illuminated structures reported recently by several companies take advantage of solder bump technology to electrically connect elements of the array to an external substrate or PC board using the contacts (bumps) on the front surface of the structure. By utilizing solder bump technology, the metal interconnects, which usually reside on top of the active surface between the adjacent elements openings, may be moved to the substrate or PC board upon which the chip is mounted. Such an approach allows minimizing the gaps between adjacent elements of the array, at the same time allowing a virtually unlimited total number of elements. However, several drawbacks of the previously reported back illuminated structures limit their application:

1) First, these structures are usually fabricated using relatively thick wafers (>50 μm) and the resistivity of the material has to be high enough (>1000 Ohm-cm) to deplete the entire volume at zero bias, which is required for many applications;
2) Second, the application of a high resistivity material usually diminishes the photodiode performance with respect to the leakage current and shunt resistance;
3) Third, if a high resistivity material is not used, then the time response will be very long (micro seconds or even longer) because the time response would be determined by the diffusion processes rather than drift processes of the totally depleted structures;
4) Fourth, there are little or no structural features that isolate adjacent cells from each other within the entire thickness of the device, which results in relatively high cross-talk, especially at zero bias.

Summarizing, such parameters as the leakage current, shunt resistance, cross-talk, spectral sensitivity, and temporal response are of main concern for the prior art of back illuminated structures. Additionally, the handling of thin wafers (<50 μm thickness) in the wafer fabrication process is a matter of great concern by itself, and would become increasingly important with the further decrease of the wafer thickness.

BRIEF DESCRIPTION OF THE DRAWINGS

The main ideas of the invention are demonstrated by the accompanying drawings, in which.

DETAILED DESCRIPTION OF THE PREFERRED EMBODIMENTS

The objectives of the present invention include:

1) To provide a multiple element, back side illuminated 2D-photodiode array with a superior performance of all elements;
2) To provide a fabrication method for the back side-illuminated photodiode array on an ultra thin wafer.

It is therefore an object of this invention to provide a structure for silicon multi-element, 2-D photodiode arrays having greatly improved characteristics over prior art arrays, making it useful in such applications as CT scanner applications, etc.

Another object is to provide a method of fabricating Si devices on ultra thin wafers, which method can be suitable for fabrication of flip-chip, multi-element, 2-dimensional arrays of silicon photodiodes.

These and other objects of the present invention will become apparent from the following disclosure. In this disclosure, first preferred embodiments of finished diode arrays will be described, and then the preferred method of fabricating the arrays will be described.

Figure 2:
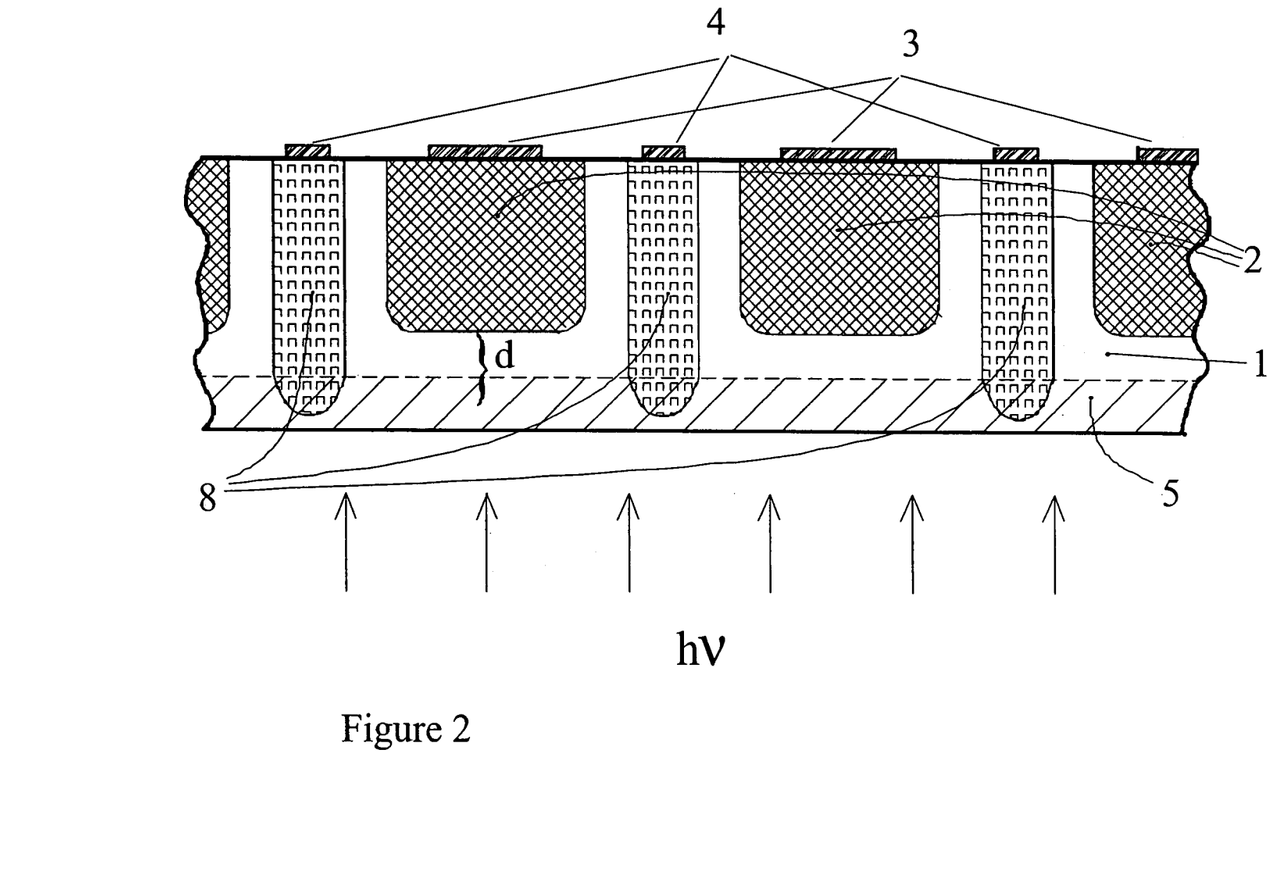
FIG. 2 is a schematic cross section of an ultra thin, back illuminating photodiode array in accordance with the present invention.

FIG. 2 is a simplified cross-sectional view of a semiconductor ultra-thin chip photodiode array in accordance with a preferred embodiment of the present invention. The structure is built using either n-type or p-type bulk silicon 1. For brevity, the anode in the case of p-on-n structure or the cathode in the case of n-on-p structure will be referred to as "the first electrode", while the cathode in the case of p-on-n structure and the anode in the case of n-on-p structure will be referred to as "the second electrode."

Figure 6:
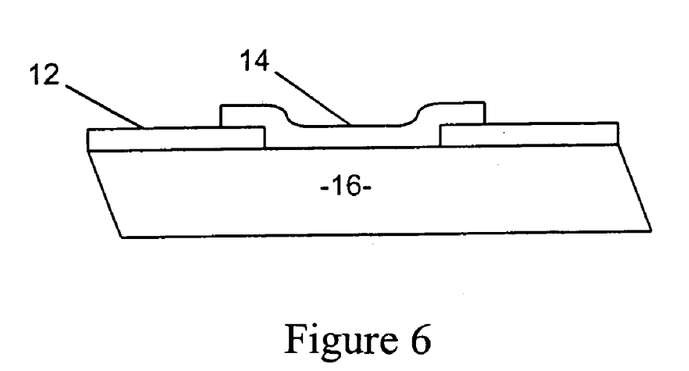
FIG. 6 is a cross section taken through one of the metal contacts of FIG. 5.

The material resistivity, thickness of the wafer/die, dopants concentrations and doses, and diffusion conditions are preferably chosen to satisfy the following requirements:

a) The active area (the first electrode) diffusion 2 extends sufficiently close to the back surface of the finished die that the rest of the volume between the diffusion edge and the blanket implant in the die back surface and part of the blanket implant, the space indicated as "d" in the FIG. 2, becomes completely depleted at a zero volt bias;

b) The uniform, "blanket" type implantation 5 of the back side of the wafer with the implant of the same polarity as the one of the majority carriers of the wafer bulk 1 provides excellent majority carrier conductivity across the wafer back side; and ensures a vertical electric field for carrier collection beneath the first electrode to minimize cross talk;

c) The second electrode, diffusion 8, is applied from the front surface of the wafer using the implantation and drive protocols that allow for the diffusion to reach the wafer back side, overlapping thereby with the blanket implantation 5 and providing perfect electrical contacts between the second electrode network across the entire wafer. At the same time, an oxide layer 12 is grown on the front surface, shown in FIG. 6, but not shown in the earlier Figures for clarity in the illustrations of the doped regions.

Figure 3:
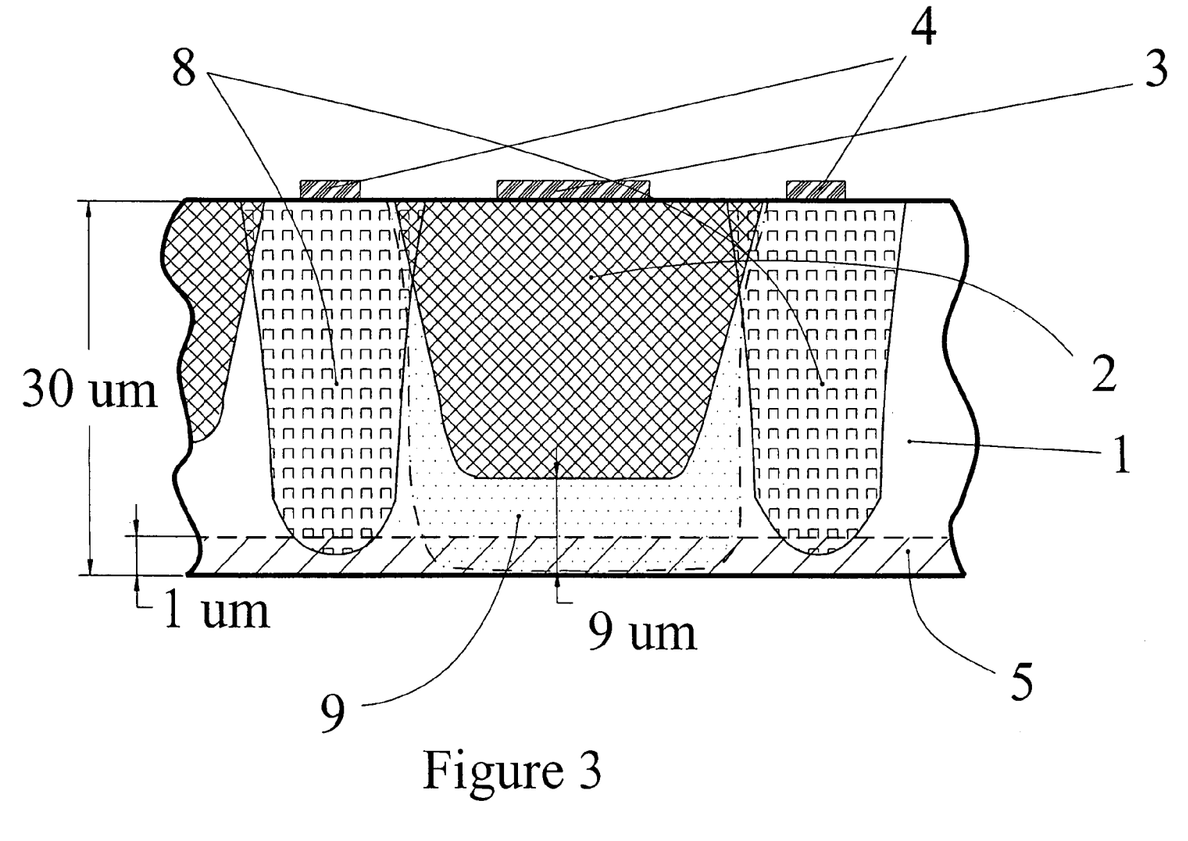
FIG. 3 is a schematic cross section of a sample structure of the present invention having a 30 μm thick, n-type Silicon wafer.

An example of a real structure built using a n-type bulk Si with the resistivity of approximately 400 ohm-cm is shown schematically in FIG. 3. At a zero bias, the width of a depletion region is approximately 9 µm and extends up to and into (but not through) the blanket implantation 5 in the wafer back side. (See the hatched with dots area 9 in FIG. 3. The blanket diffusion 5 is only approximately 0.6 µm thick, so the depletion region extends approximately to, but not quite all the way to, the wafer back side.) The built-in potential creates an electric field across the depletion region and facilitates rapid collection of non-equilibrium carriers created by light near the back surface of the die. The non-equilibrium carriers have no or very little possibility of being collected by the electrodes from adjacent cells because:

The electric field near the die back surface, where the carriers photo-generation predominantly occurs is directed perpendicular to the die surface; therefore, the carriers move (drift) primarily toward the junction of the same cell, having almost no possibility of being trapped by an adjacent cell;

The second electrode diffusion region 8, which is n+ diffusion in the case of FIG. 3, spans the entire thickness of the die and acts as an effective carrier isolator from adjacent cells.

The first electrode diffusion 2 may overlap with the second electrode diffusion 8 close to the front surface of the die as shown in FIG. 3. This overlapping may significantly decrease the breakdown voltage, which is not important for a zero bias device.

Thus, exemplary representative diffusion profiles of the first electrode 2 and second electrode 8 are shown in FIG. 3. The depth of the first electrode diffusion 2 should be less than the finished substrate thickness (typically less than 50 µm, and more typically approximately 30 µm as shown in FIG. 3) by an amount that approximately equals the depletion depth for the substrate material 1 at zero bias. The second electrode diffusion 8 should span the entire thickness of the substrate, or at least to a sufficient depth to provide a reliable low resistance contact with the blanket implantation 5 of the back side of the wafer. Note that the dopants 5 and 8 are of the same polarity.

Figure 4A:
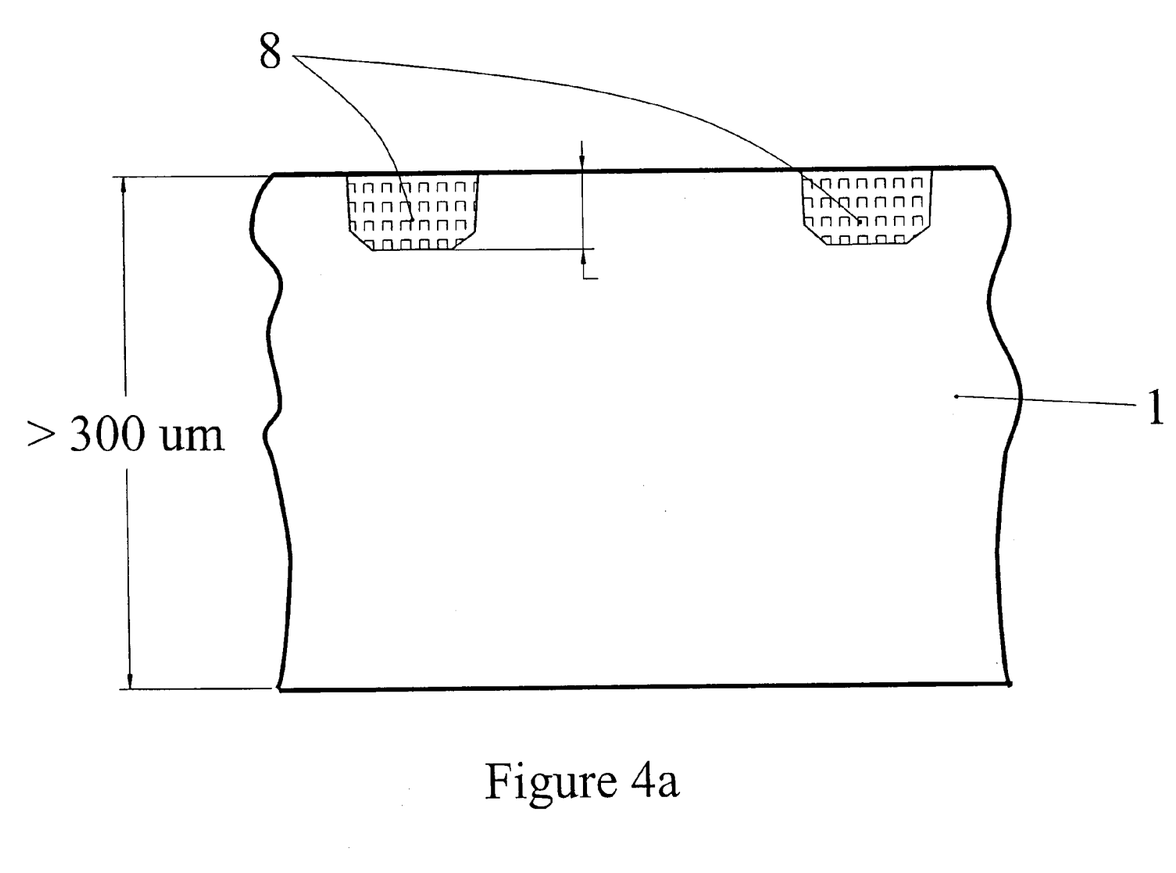
FIG. 4a through 4c illustrate sequential steps of a method for fabricating electrodes of a thin wafer photodiode array structure in accordance with the present invention.

Such a structure may be fabricated starting with a thicker substrate (for example 300 µm) for structural stiffness and integrity during the processing, using three masking steps:

First, as shown in FIG. 4a, the second electrode 8 implantation/diffusion is applied followed by a drive. At this stage, the difference in the final diffusion depths for the first electrodes 2 and second electrodes 8 (approximately 9 µm) is formed.

Figure 4B:
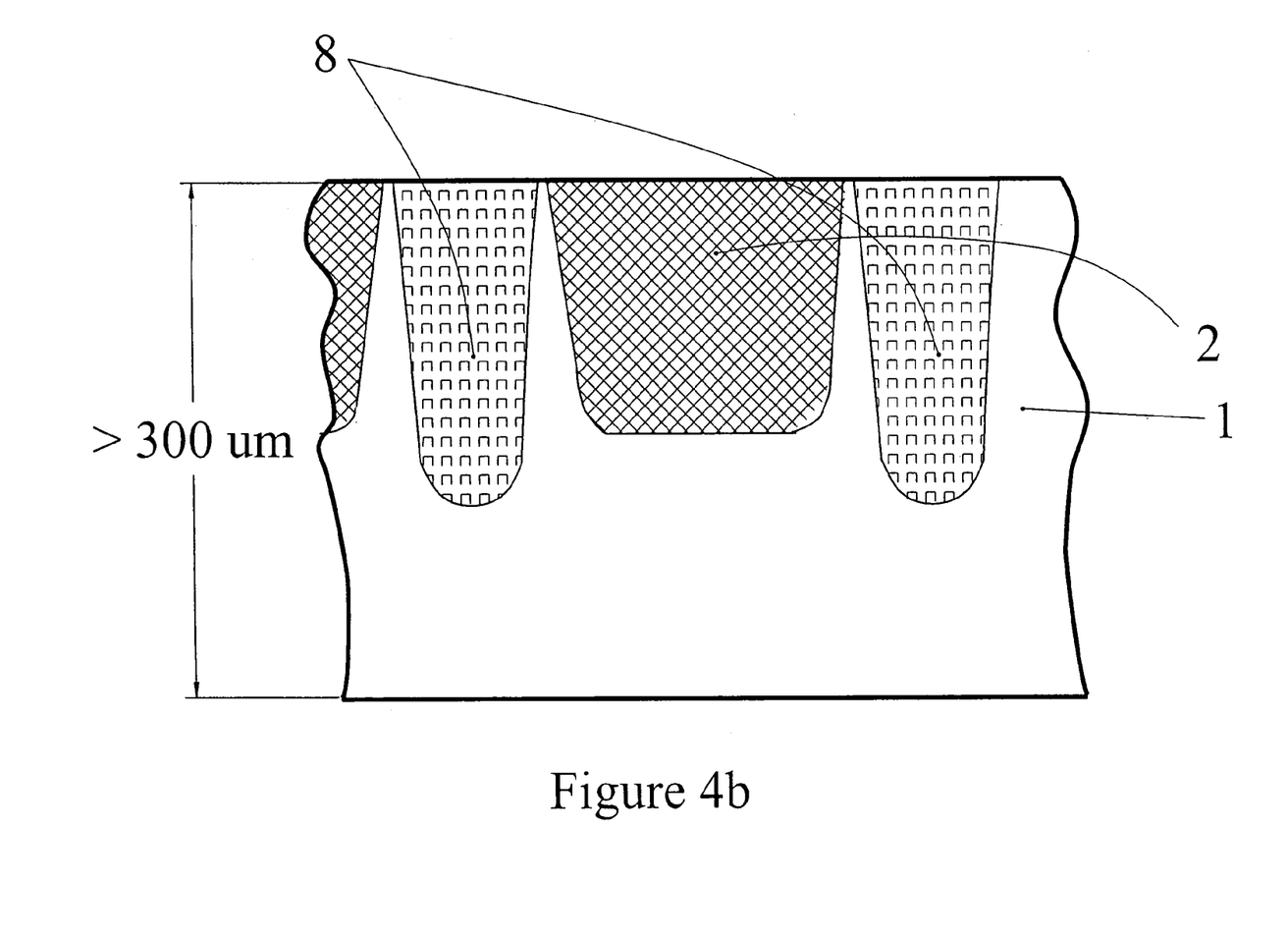

Second, as shown in FIG. 4b, the first electrode 2 implantation/diffusion is applied followed by a drive. By the end of this stage, the diffusion profiles 2 and 8 almost reach their final configuration.

Figure 4C:
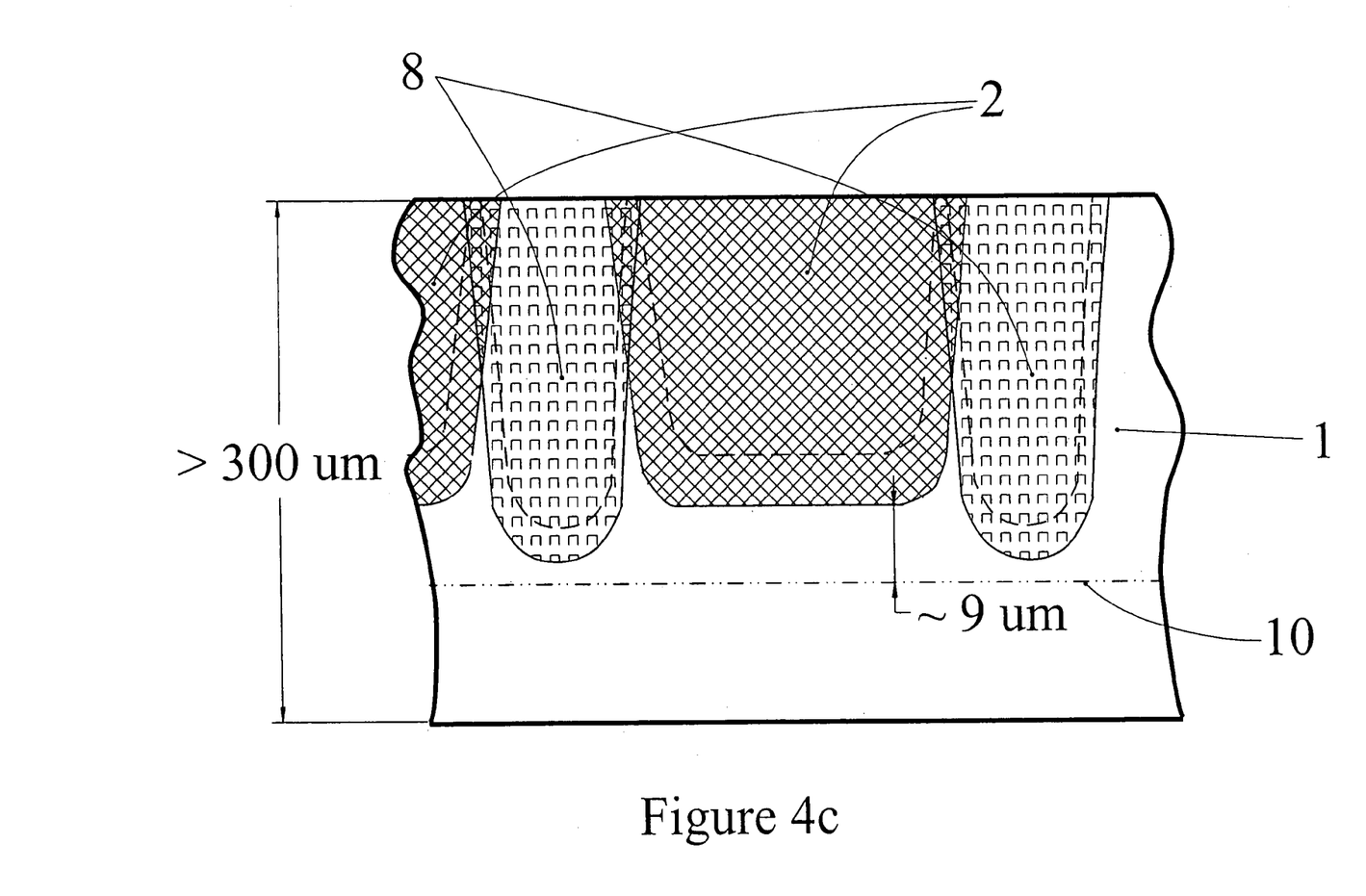

Third, as shown in FIG. 4c, the second electrode 8 receives an additional enhancement followed by a drive to ensure superior electrical contacts and to activate dopants. At this stage, the profiles of both the cathode and anode diffusions reach their final configurations (see the solid lines and hatched areas in FIG. 4c). The diffusion profiles prior to this third step of dopants implantation/diffusion/drive are shown schematically with the dashed lines in FIG. 4c. The future back surface of the wafer after back side grinding and polishing is shown schematically with the dashed line 10.

The array is then reduced in thickness by grinding the back side of the array, preferably to provide a substrate thickness of under approximately 50 µm, and more preferably to approximately 30 µm. The final thickness achieved, of course, is preferably selected in accordance with the resistivity of the substrate and the depth of the first electrode diffusion so that the diffusion is spaced away form the back side of the substrate an amount that approximately equals the depletion depth for the substrate material at zero bias. Then a blanket implant of the first conductivity type is made to the back side of the wafer, which implant improves both the charge collection efficiency and DC/AC electrical performance of the photodiode arrays. Activation of the implant does not significantly alter the first and second electrode diffusions. Alternatively, a diffusion for the back side could be used if desired. The blanket implant is quite thin compared to the depletion region, with the depletion region extending into, but not through, the blanket implant in the final array.

Figure 5:
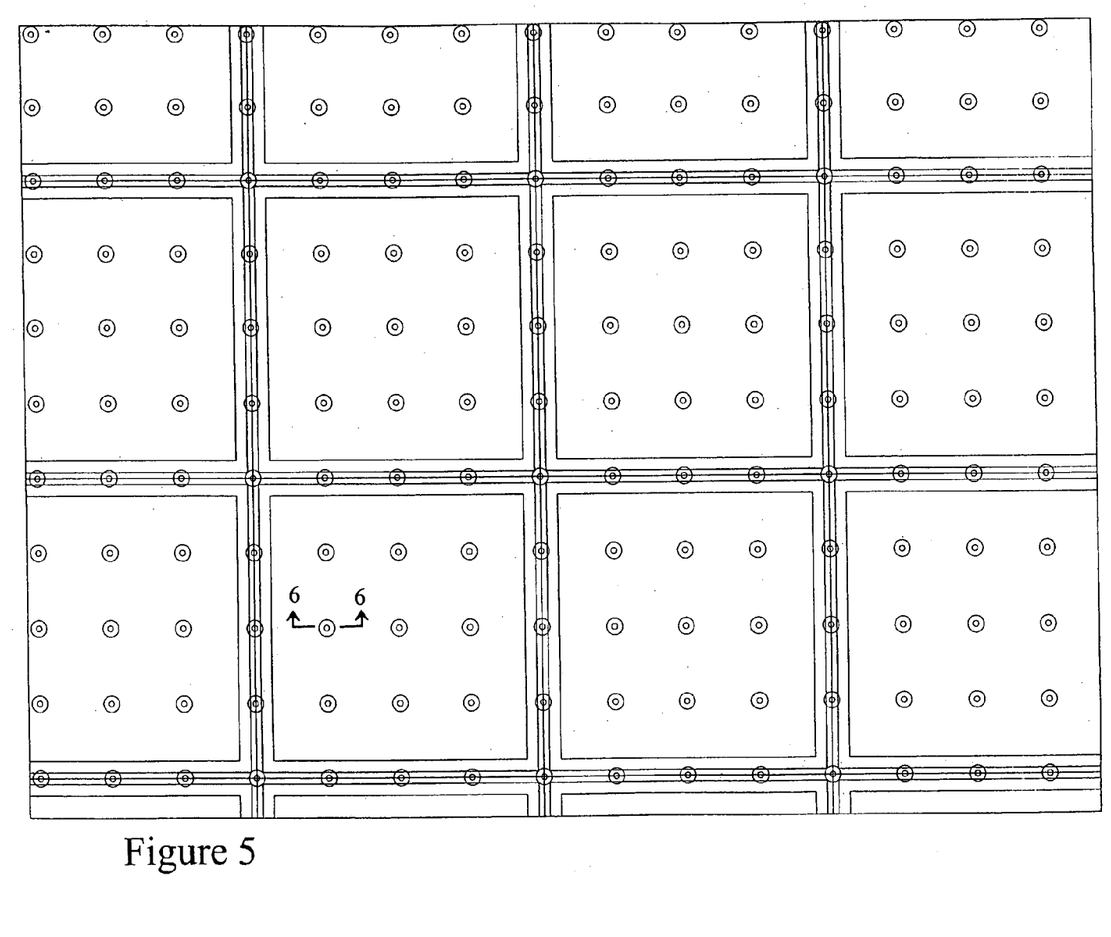
FIG. 5 illustrates an exemplary layout of cathode and anode pads across the front surface of the wafer.

An ideal flatness of the back side surface of the die is very important for many applications, e.g., for CT scanners that require attaching of a scintillator crystal to the back side of the photodiode array. To help satisfy this requirement, the oxide layer 12 is evenly patterned and the metal pads 14 contacting the first electrode 2 and second electrode 8 are evenly spaced across the surface of the die 16 and made the same size to provide identical ball bumping conditions throughout the wafer (see FIGS. 5 and 6). The oxide layer 12 and metal pads 14 are represented by the larger diameter circles in FIG. 5, with the smaller diameter circles describing the contact openings.

The present invention photodiode arrays exhibit very low cross talk because of the excellent isolation of each pixel. Also, because of the small depletion volume, the arrays exhibit low noise and low temperature sensitivity. When used in X-ray systems, they exhibit low radiation damage, and have thermal characteristics similar to scintillators to which they will are mounted. The technique of using a deep diffusion in conjunction with a thin substrate for making electrical contact to the back side of the substrate may, of course be used in other semiconductor devices. While the deep diffusion in the preferred embodiment is of the same conductivity type as the substrate, this is not a limitation of the invention, as the deep diffusion may be of the opposite conductivity type, if desired.

While preferred exemplary embodiments of the present invention have been disclosed herein, such disclosure is only for purposes of understanding the exemplary embodiments and not by way of limitation of the invention. It will be obvious to those skilled in the art that various changes in fabrication process and structure of the photodiode arrays may be made without departing from the spirit and scope of the invention, as set out in the full scope of the following claims.

What is claimed is:

1. A method of fabricating a photodiode array comprising:
   providing a semiconductor substrate having first and second surfaces;
   providing a first region in the form of a matrix of regions of a first conductivity type of a higher conductivity than the substrate, including a high temperature diffusion, the first region extending into the substrate from the first surface;
   providing a plurality of regions of a second conductivity type interspersed within the matrix of regions of the first conductivity type, including an additional high temperature diffusion, a second region extending into the substrate from the first surface a shorter distance than the first region;
   grinding the substrate from the second surface to reduce the thickness of the substrate and to expose the matrix of regions of a first conductivity type and not the plurality of regions of the second conductivity type at the second surface of the substrate;
   providing a layer of the first conductivity type having a conductivity greater than the substrate on the second surface of the substrate; and,
   providing a plurality of electrical contacts at the first surface for the first region in the form of a matrix of regions of the first conductivity type and the plurality of regions of the second conductivity type.

2. The method of claim 1 wherein the layer of the first conductivity type having a conductivity greater than the substrate on the second surface of the substrate is provided by implantation.

3. The method of claim 1 wherein the substrate is ground to a thickness that separates the plurality of regions of the second conductivity type from the second surface of the substrate by an amount that approximately equals the depletion depth for the substrate at zero bias.

4. The photodiode array of claim 1 wherein the plurality of regions of the second conductivity type are separated from the second surface of the substrate by approximately 9 μm.

5. The method of claim 3 wherein the substrate provided is an n-type silicon substrate having a resistivity of approximately 400 ohm-cm.

6. The method of claim 1 wherein the plurality of contacts are a plurality of ball grid contacts.

7. The method of claim 6 wherein the plurality of contacts are of substantially equal size evenly distributed across the photodiode array.

8. The method of claim 1 wherein the substrate is ground to a thickness of less than approximately 50 μm.

9. The method of claim 1 wherein the substrate is ground to a thickness of approximately 30 μm.

10. A method of fabricating a photodiode array comprising:
    providing a silicon substrate having first and second surfaces;
    providing a first region in the form of a matrix of regions of a first conductivity type of a higher conductivity than the substrate, including a high temperature diffusion, the first region extending into the substrate from the first surface;
    providing a plurality of regions of a second conductivity type interspersed within the matrix of regions of the first conductivity type, including an additional high temperature diffusion, the second region extending into the substrate from the first surface a shorter distance than the first region;
    providing additional doping of the first region, including a further high temperature diffusion;
    grinding the substrate from the second surface to reduce the thickness of the substrate to less than approximately 50 μm and to expose the matrix of regions of a first conductivity type and not the plurality of regions of the second conductivity type at the second surface of the substrate;
    providing a layer of the first conductivity type having a conductivity greater than the substrate on the second surface of the substrate; and,
    providing a plurality of electrical contacts at the first surface for the first region in the form of a matrix of regions of the first conductivity type and the plurality of regions of the second conductivity type.

11. The method of claim 10 wherein the layer of the first conductivity type having a conductivity greater than the substrate on the second surface of the substrate is provided by implantation.

12. The method of claim 10 wherein the substrate is ground to a thickness that separates the plurality of regions of the second conductivity type from the second surface of the substrate by an amount that approximately equals the depletion depth for the substrate at zero bias.

13. The photodiode array of claim 10 wherein the plurality of regions of the second conductivity type are separated from the second surface of the substrate by approximately 9 μm.

14. The method of claim 12 wherein the substrate provided is an n-type silicon substrate having a resistivity of approximately 400 ohm-cm.

15. The method of claim 10 wherein the plurality of contacts are a plurality of ball grid contacts.

16. The method of claim 15 wherein the plurality of contacts are of substantially equal size evenly distributed across the photodiode array.

17. The method of claim 10 wherein the substrate is ground to a thickness of approximately 30 μm.

18. A method of fabricating a semiconductor device comprising:

providing a semiconductor substrate of a first conductivity type;

forming the semiconductor device on a first surface of the semiconductor substrate, including forming deep diffusions extending through the substrate from the first surface to a second surface of the substrate, the deep diffusions extending through the substrate being formed by forming diffusions that are deeper than diffusions of the semiconductor device, and grinding the substrate from the second surface to reduce the thickness of the substrate to expose the deep diffusions from the second surface of the substrate; and, forming a blanket region of the same conductivity type as the deep diffusions on the second surface of the substrate.

19. The method of claim 18 wherein the substrate is of a first conductivity type and the deep diffusions and the blanket region are of a second conductivity type.

20. A method of fabricating a semiconductor device comprising:

providing a semiconductor substrate of a first conductivity type; and, forming the semiconductor device on a first surface of the semiconductor substrate, including forming deep diffusions extending through the substrate from the first surface to a second surface of the substrate, the deep diffusions extending through the substrate being formed by forming diffusions that are deeper than diffusions of the semiconductor device but do not extend through the substrate, and grinding the substrate from the second surface to reduce the thickness of the substrate to expose the deep diffusions from the second surface of the substrate.

21. In a method of fabricating a photodiode array, the improvement comprising:

providing a semiconductor substrate having first and second surfaces;

providing a matrix of regions of a first conductivity type of a higher conductivity than the substrate, including a high temperature diffusion, the matrix of regions extending into the substrate from the first surface;

grinding the substrate from the second surface to reduce the thickness of the substrate and to expose the matrix of regions of a first conductivity type;

providing a layer of the first conductivity type having a conductivity greater than the substrate on the second surface of the substrate; and, providing a plurality of electrical contacts at the first surface for the matrix of regions of a first conductivity type and for the regions within the matrix.

22. The improvement of claim 21 wherein the layer of the first conductivity type having a conductivity greater than the substrate on the second surface of the substrate is provided by implantation.

23. The improvement of claim 21 wherein the substrate provided is an n-type silicon substrate having a resistivity of approximately 400 ohm-cm.

24. The improvement of claim 21 wherein the substrate provided is a p-type silicon substrate.

25. The improvement of claim 21 wherein the plurality of contacts are a plurality of ball grid contacts.

26. The improvement of claim 25 wherein the plurality of contacts are of substantially equal size evenly distributed across the photodiode array.

27. The improvement of claim 21 wherein the substrate is ground to a thickness of less than approximately 50 μm.

28. The improvement of claim 21 wherein the substrate is ground to a thickness of approximately 30 μm.

29. The improvement of claim 21 wherein the substrate is of the first conductivity type.

30. The improvement of claim 21 wherein the substrate is of a second conductivity type.

* * * * *